United States Patent
Yamashita

(10) Patent No.: US 7,511,473 B2
(45) Date of Patent: Mar. 31, 2009

(54) PRESSING MEMBER AND ELECTRONIC COMPONENT HANDLING DEVICE

(75) Inventor: Tsuyoshi Yamashita, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 11/979,088

(22) Filed: Oct. 31, 2007

(65) Prior Publication Data
US 2008/0122433 A1 May 29, 2008

Related U.S. Application Data

(63) Continuation of application No. 11/142,663, filed on Jun. 2, 2005, now Pat. No. 7,309,981, which is a continuation of application No. PCT/JP02/12687, filed on Dec. 4, 2002.

(51) Int. Cl.
*G01R 31/28* (2006.01)
(52) U.S. Cl. .................................. 324/158.1
(58) Field of Classification Search .............. 324/754, 324/757, 760, 765, 158.1; 414/17, 217, 907
See application file for complete search history.

(56) References Cited

U.S. PATENT DOCUMENTS

| | | | |
|---|---|---|---|
| 6,057,700 A | 5/2000 | Crispell | |
| 6,069,483 A | 5/2000 | Maxwell et al. | |
| 6,369,595 B1* | 4/2002 | Farnworth et al. | 324/755 |
| 6,590,383 B2* | 7/2003 | Yamashita et al. | 324/158.1 |
| 7,309,981 B2* | 12/2007 | Yamashita | 324/158.1 |

FOREIGN PATENT DOCUMENTS

| | | |
|---|---|---|
| JP | A-11-329646 | 11/1999 |
| JP | A-2002-131379 | 5/2002 |

OTHER PUBLICATIONS

Search Report from European Patent Office Issued on Jan. 3, 2006 for the corresponding European patent application No. 02783760.8-2216.

* cited by examiner

*Primary Examiner*—Ha Tran T Nguyen
*Assistant Examiner*—Tung X Nguyen
(74) *Attorney, Agent, or Firm*—Posz Law Group, PLC

(57) ABSTRACT

A first spring 54 is provided between a support member 51 driven in the Z-axis direction and a heat block 53, and biases the support member 51 and the heat block 53 in the direction of separating them from each other. A second spring 57 is provided between a first pusher 55 for pressing a die 81 of an IC device 8 and a second pusher 56 for pressing a substrate 82 of the IC device 8, and biases the first pusher 55 and the second pusher 56 in the direction of separating them from each other.

According to an electronic device handling apparatus having the above configuration, it is possible to respond to changes of kinds of electronic devices, improve surface conformance and uniformly press an electronic device with an accurate load.

2 Claims, 5 Drawing Sheets

US 7,511,473 B2

PRESSING MEMBER AND ELECTRONIC COMPONENT HANDLING DEVICE

CROSS-REFERENCE TO RELATED APPLICATIONS

This application is a continuation application of allowed U.S. application Ser. No. 11/142,663, filed on Jun. 2, 2005, now U.S. Pat. No. 7,309,981 which is a continuation application of International Application No. PCT/JP02/12687 filed on Dec. 4, 2002, both of which are incorporated herein by reference.

TECHNICAL FIELD

The present invention relates to a pressing member capable of pressing an electronic device by changing a load in accordance with a part of the electronic device in an apparatus for testing an IC device and other electronic devices, and an electronic device handling apparatus provided with the pressing member.

BACKGROUND ART

In a production procedure of an electronic device, such as an IC device, an electronic device testing apparatus for testing performance and functions of finally produced IC devices and devices at its intermediate stage, etc. is necessary.

A test of an IC device by using an electronic device testing apparatus is performed, for example, as below. After conveying an IC device to be tested to above a test head attached with a socket, the IC device is pressed to be loaded on the socket, so that connection terminals of the socket are brought to contact with external terminals of the IC device. As a result, the IC device is electrically connected to a tester main body through the socket, the test head and a cable. Then, by applying a test signal supplied from the tester main body to the test head via the cable to the IC device and sending a response signal read from the IC device to the tester main body via the test head and the cable, electric characteristics of the IC device are measured.

The above test is often conducted by imposing a thermal stress on an IC device to be tested. As a method of giving a thermal stress to the IC device, for example, a method of heating the IC device to be a predetermined temperature before conveying it to the test head is used and, furthermore, a method of heating the IC device by providing a heater to a device for conveying the IC device so as not to lower the temperature of the heated IC device 8 in its conveying step is used.

Here, depending on a kind of the IC device to be tested, as for a die (IC chip) part composed of the integrated circuit, it is necessary not to break a fine integrated circuit by an excessive load at the time of pressing, and as for a substrate part of the IC device, a contact mistake (imperfect contact with contact terminals of the socket) has to be prevented by giving a certain amount of load. Namely, the pressing load has to be changed between a die part and other substrate part of the IC device in some cases. Furthermore, since it is the die portion of the IC device that the temperature matters in an actual use, the thermal stress is preferably given particularly to the die.

Thus, conventionally, a test has been conducted by absorbing and pressing an IC device to be tested by an IC device suction device provided with a suction/pressing portion 15P as shown in FIG. 5. The conventional suction/pressing portion 15P comprises a support member 51P driven in the Z-axis direction by a Z-axis actuator, a joint member 52P provided to a peripheral portion on the lower side of the support member 51P, a heat block 53P provided at the center portion on the lower side of the support member 51P, a first pusher 55P provided on the lower side of the heat block 53P for pressing a die 81 of an IC device 8, and a second pusher 56P provided on the lower side of the joint member 52P for pressing a substrate 82 of the IC device 8; and performs temperature control and load management of the IC device 8 (prevention of an excessive load on the die 81 and prevention of a contact mistake of the substrate 82) by heating and pressing the die 81 of the IC device 8 by the first pusher 55P contacting with the heat block 53P and pressing the substrate 82 of the IC device 8 by the second pusher 56P.

However, when testing different kinds of IC devices 8, it was necessary to modify and change respective members to be corresponding to the respective IC devices in the suction/pressing portion 15P configured as above and the operation took a large amount of cost and time. Also, since surface conformance of a lower surface of the heat block 53P and an upper surface of the first pusher 55P, and surface conformance of a lower surface of the first pusher 55P and an upper surface of the die 81 were not secured, uniform pressing with an accurate load against the fine die 81 of the IC device 8 was not possible, and a heat transfer property from the heat block 53 to the die 81 of the IC device 8 via the first pusher 55 was poor, so that reliable temperature control of the die 81 was not able to be made.

Therefore, as shown in FIG. 6, there was a proposal of providing a spring 54P between the supporting member 51P and the heat block 53P so as to bias them in the direction of separating the two. In a suction/pressing portion 15P' configured as above, a load on the die 81 of the IC device 8 can be managed by securing a certain range due to the elastic effect of the spring 54P, so that it is possible to respond to changes of kinds of the IC devices 8 without changing the respective members in some cases. However, when load management by the same spring 54P is not possible, the spring 54P has to be changed and the replacing operation of the spring 54P is very cumbersome.

Also, problems caused by a surface conformance defect can be improved to some extent by the elastic effect of the spring 54P, however, both of the surface conformance of the lower surface of the heat block 53P and the upper surface of the first pusher 55P and surface conformance of the lower surface of the first pusher 55P and the upper surface of the die 81 of the IC device 8 are not always secured, and uniform pressing with an accurate load and reliable temperature control have not been always attained.

DISCLOSURE OF THE INVENTION

The present invention was made in consideration of the above circumstances and has as an object thereof to provide a pressing member and an electronic device handling apparatus capable of responding to changes of kinds of electronic devices, improving surface conformance and uniformly pressing the electronic devices with an accurate load.

To attain the above object, according to the first aspect of the present invention, there is provided a pressing member for pressing terminals of an electronic device to be tested against a contact portion of a test head in an electronic device handling apparatus, comprising:

a first pressing member for pressing a first part of the electronic device (for example, a die of an IC device) by being pressed by a body side-first pressing member elastically biased in the pressing direction, and a second pressing member for pressing a second part of the electronic device (for example, a substrate of an IC device) by being pressed by a body side-second pressing member;

wherein said first pressing member and said second pressing member are elastically connected in the pressing/receding direction (1).

In the above invention (1), it is possible to separately manage a pressing load on a first part and a pressing load on a second part of the electronic device by the first pressing member and the second pressing member, so that it is possible, for example, to press with a load of not damaging an integrated circuit against a die part of the IC device and to press with a load capable of preventing a contact mistake against a substrate part of the IC device.

Particularly, in the first invention (1), the first pressing member is pressed by a body side-first pressing member elastically biased in the pressing direction, and the first pressing member and the second pressing member are elastically connected in the pressing/receding direction, so that both of the surface conformance of the body side-first pressing member and the first pressing member and surface conformance of the first pressing member and the electronic device are secured. Consequently, it is possible to uniformly press the first part of the electronic device with an accurate load in the surface direction. Note that "surface conformance" in the present specification means that a plane contacts other plane uniformly in the surface direction.

Also, as a result that the first pressing member and the second pressing member are elastically connected in the pressing/receding direction, a load on the electronic device can be managed by securing a certain range, it is possible to respond to changes of kinds of electronic devices without changing the first pressing member and the second pressing member. In the case where the load cannot be managed by the elastic force between the first pressing member and the second pressing member, it is possible to respond to changes of kinds of the electronic devices by changing the elastic force. Note that when the load has to be widely changed due to changes of kinds of the electronic devices, it is possible to respond by changing the elastic force of pressing the body side-first pressing member.

In the above invention (1), preferably, an elastic member is provided between said first pressing member and said second pressing member, for biasing them in the direction of separating them from each other (2). According to the present invention (2), the first pressing member and the second pressing member can be elastically connected in the pressing/receding direction with a simple configuration. Note that the above invention (1) is not limited to the configuration.

In the above inventions (1 and 2), said body side-first pressing member may have a temperature control function for controlling a temperature of said first pressing member (3). For example, by making the body side-first pressing member to be a heating source by a heater, etc. or to be a cooling source by a cooling element or a cooling fin, etc., a temperature of the first pressing member can be controlled.

According to the above invention (3), a temperature of a part of the electronic device pressed by the first pressing member can be controlled and a test at a set temperature can be conducted. Also, as explained above, since both of surface conformance of the body side-first pressing member and the first pressing member, and surface conformance of the first pressing member and the electronic device are secured, a heat transfer property from the body side-first pressing member to the electronic device via the first pressing member becomes excellent and temperature control on a part of the electronic device can be surely made.

Preferably, said pressing members are attached in a removable way to an electronic device handling apparatus body side provided with said body side-first pressing member and said body side-second pressing member (4). Due to the configuration, even in the case where a load cannot be managed by the elastic force between the first pressing member and the second pressing member when changing kinds of the electronic devices, it is possible to extremely easily respond to changes of kinds of electronic devices by changing the elastic force by replacing the pressing members (the first pressing member and the second pressing member).

According to a second aspect of the present invention, there is provided an electronic device handling apparatus for pressing terminals of an electronic device to be tested against a contact portion of a test head to conduct a test on the electronic device, comprising: a first pressing member for pressing a first part of the electronic device (for example, a die of an IC device); a second pressing member for pressing a second part of the electronic device (for example, a substrate of an IC device); a body side-first pressing member elastically biased in the pressing direction, for pressing said first pressing member; and a body side-second pressing member for pressing said second pressing member; wherein said first pressing member and said second pressing member are elastically connected in the pressing/receding direction (5).

In the above invention (5), it is possible to separately manage a load of pressing a first part and a load of pressing a second part of the electronic device by the first pressing member and the second pressing member, so that it is possible, for example, to press with a load of not damaging an integrated circuit against a die part of the IC device and to press with a load capable of preventing a contact mistake against a substrate part of the IC device.

Particularly, in the above invention (5), the first pressing member is pressed by the body side-first pressing member elastically biased in the pressing direction, and the first pressing member and the second pressing member are elastically connected in the pressing/receding direction, so that both of surface conformance of the body side-first pressing member and the first pressing member and surface conformance of the first pressing member and the electronic device are secured, and uniform pressing with an accurate load against a first part of the electronic device in the surface direction can be attained.

Also, as a result that the first pressing member and the second pressing member are elastically connected in the pressing/receding direction, a load on the electronic device can be managed by securing a certain range, so that it is possible to respond to changes of kinds of electronic devices without changing the first pressing member and the second pressing member. When a load cannot be managed by the elastic force between the first pressing member and the second pressing member, it is possible to respond to changes of kinds of electronic devices by changing the elastic force. Note that when the load has to be widely changed due to changes of kinds of the electronic devices, it can be attained by changing an elastic force of pressing the body side-first pressing member.

In the above invention (5), preferably, an elastic member is provided between said first pressing member and said second pressing member, for biasing them in the direction of separating them from each other (6). According to the present invention (6), the first pressing member and the second pressing member can be elastically connected in the pressing/receding direction with a simple configuration. Note that the above invention (5) is not limited to the configuration.

In the above invention (5 and 6), preferably, an elastic member is provided between said body side-first pressing member and a body side-third pressing member, which presses said body side-first pressing member and said body side-second pressing member, for biasing them in the direction of separating them from each other (7). According to the present invention (7), the first pressing member can be elastically biased in the pressing direction with a simple configuration. Note that the above inventions (5 and 6) are not limited to the configuration.

In the above inventions (5 to 7), the body side-first pressing member may be provided with a temperature control function for controlling a temperature of the first pressing member (8). According to the present invention (8), a temperature can be controlled on a part of the electronic device to be pressed by the first pressing member, and a test at a set temperature can be conducted. Also, as explained above, both of surface conformance of the body side-first pressing member and the first pressing member, and surface conformance of the first pressing member and the electronic device are secured, so that a heat transfer property form the body side-first pressing member to the electronic device via the first pressing member become excellent, and temperature control on a part of the electronic device can be surely made.

In the above inventions (5 to 8), preferably, the pressing member provided with said first pressing member and said second pressing member is attached in a removable way to an electronic device handling apparatus body side provided with said body side-first pressing member and said body side-second pressing member (9). Due to the configuration, even in the case where a load cannot be managed by the elastic force between the first pressing member and the second pressing member when changing kinds of electronic devices, it is possible to extremely easily respond to changes of kinds of electronic devices by replacing the pressing members (the first pressing member and the second pressing member) to change the elastic force.

BEST MODE FOR CARRYING OUT THE INVENTION

Below, an embodiment of the present invention will be explained in detail based on the drawings.

Figure 1:
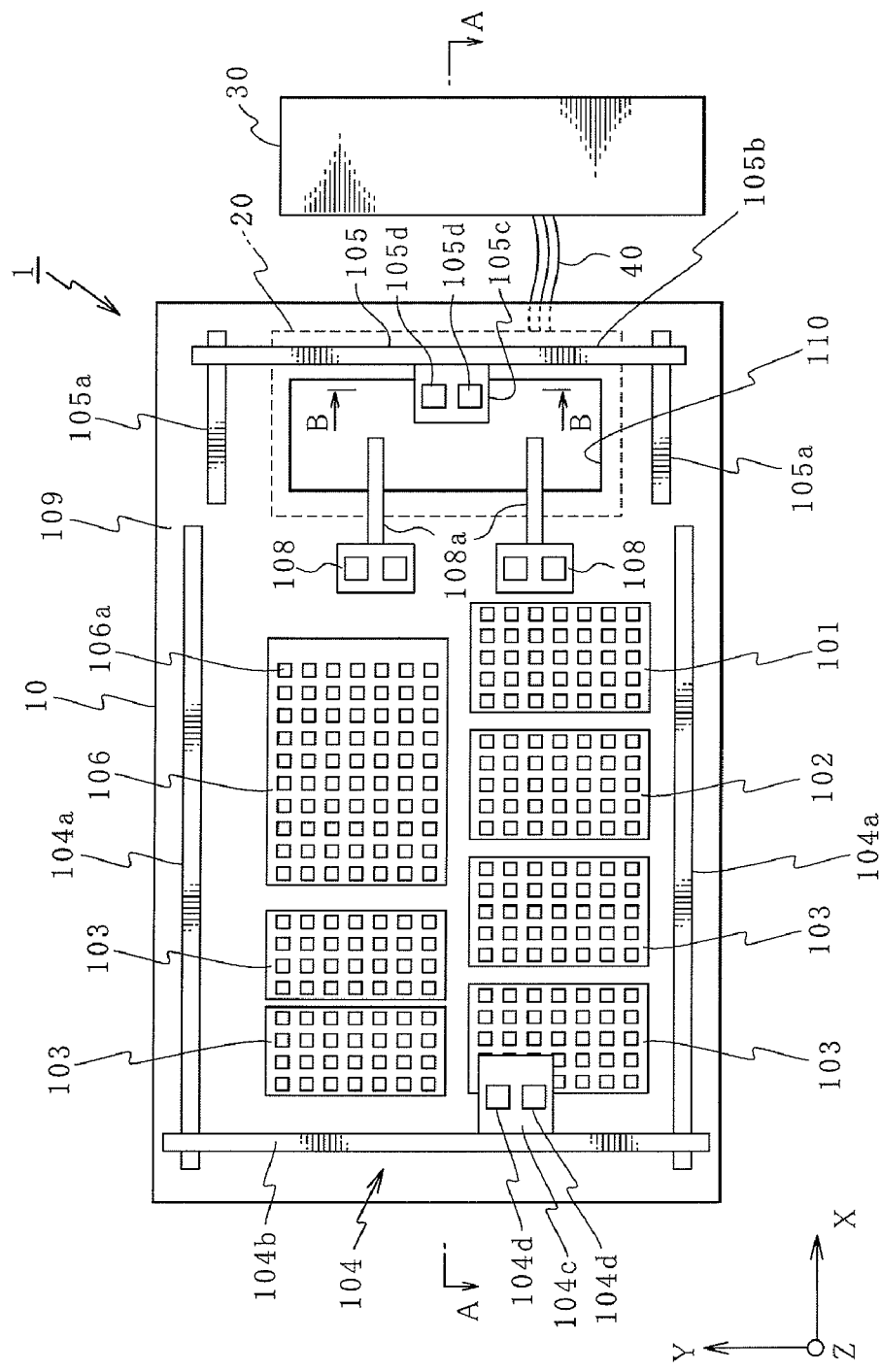
FIG. 1 is a plan view of an electronic device testing apparatus wherein an electronic device testing handling apparatus according to an embodiment of the present invention is applied.
Figure 2:
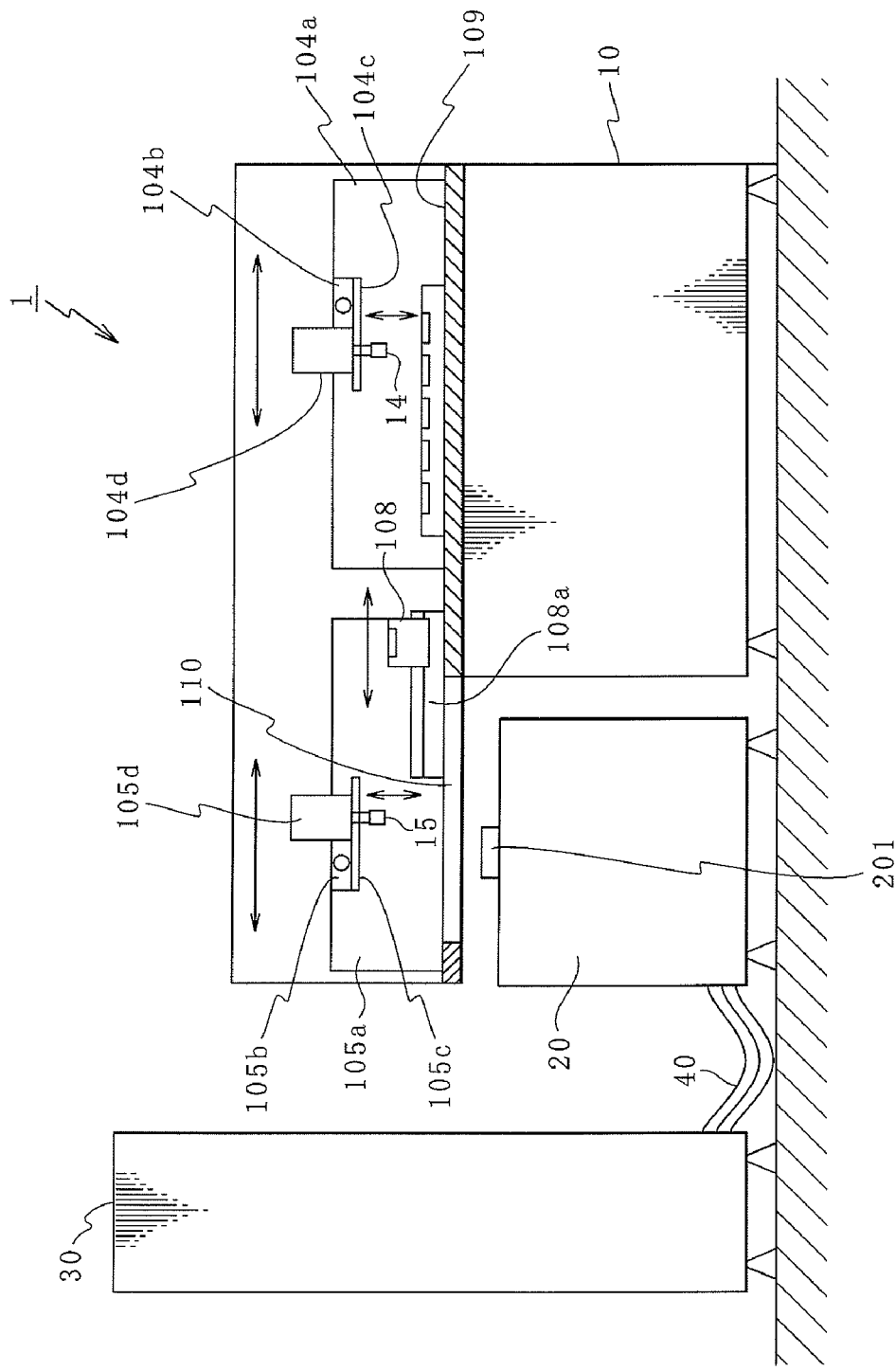
FIG. 2 is a partial sectional view (along the line, A-A) of the electronic device testing apparatus in FIG. 1.

As shown in FIG. 1 and FIG. 2, the electronic device testing apparatus 1 comprises an electronic device handling apparatus (hereinafter, referred to as "a handler") 10, a test head 20 and a tester main body 30, wherein the test head 20 and the tester main body 30 are electrically connected via a cable 40.

The handler 10 is provided with a substrate 109, and the substrate 109 is provided with an empty tray 101, a supply tray 102, classifying trays 103, two X-Y conveyors 104 and 105, a heat plate 106 and two buffer portions 108 thereon. Also, the substrate 109 is formed with an opening portion 110 and, as shown in FIG. 2, a contact portion 201 of the test head 20 arranged on the back side of the handler 10 is loaded with the IC device 8 through the opening portion 110 of the substrate 109.

The electronic device testing apparatus 1 is configured to successively convey pre-test IC devices (an example of electronic devices) loaded on the supply tray of the handler 10 by the two X-Y conveyors 104 and 105, press the same against the contact portion 201 of the test head 20 by one X-Y conveyor 105, and conduct a test on the IC device 8 via the test head 20 and the cable 40, then, store post-test IC devices 8 to the classifying trays 103 in accordance with the test results. Below, the respective devices will be explained.

One X-Y conveyor 104 comprises two rails 104a provided along the X-axis direction, a rail 104b movably attached to the two rails 104a along the Y-axis direction, an attachment base 104c movably attached to the rail 104b, and two IC device suction apparatus 104d attached to the attachment base 104c. The rail 104b is movable in the X-axis direction and the attachment base 104c is movable in the Y-axis direction, so that the IC device suction apparatus 104d can move in a range from the classifying trays 103 to the supply tray 102, the empty tray 101, the heat plate 106 and the two buffer portions 108.

Figure 3:
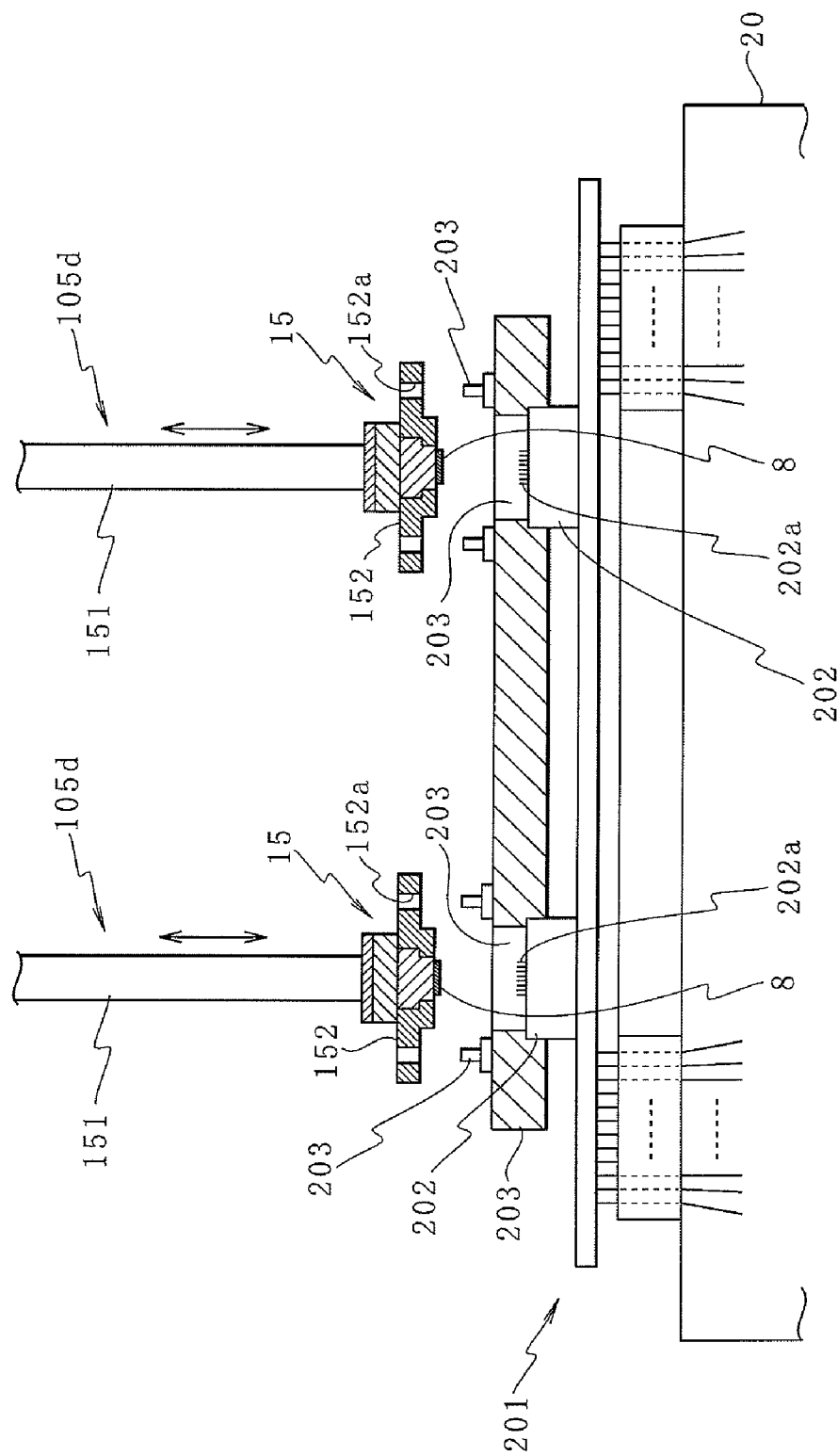
FIG. 3 is a sectional view (along the line B-B in FIG. 1) showing details of a contact portion of a test head in the same electronic device testing apparatus.

As shown in FIG. 2 and FIG. 3, a suction portion 14 capable of picking up the IC device 8 is provided to the lower end portion of the IC device suction device 104d, and the suction portion 14 is movable in the Z-axis direction (that is the upward/downward directions) via a rod by the Z-axis actuator (not shown).

Note that, in the present embodiment, since two IC device suction apparatus 104d are provided to the attachment base 104c, it is possible to pick up, convey and release two IC devices 8 at a time.

Other X-Y conveyor 105 comprises two rails 105a provided along the X-axis direction, a rail 105b movably attached to the two rails 105a along the Y-axis direction, an attachment base 105c movably attached to the rail 105b, and two IC device suction apparatus 105d attached to the attachment base 105c. The rail 105b is movable in the X-axis direction and the attachment base 105c is movable in the Y-axis direction, so that the IC device suction apparatus 105d can move in a range between the two buffer portions 108 and the test head 20.

As shown in FIG. 2 and FIG. 3, a suction/pressing portion 15 capable of picking up the IC device 8 and pressing the picked up IC device 8 against the contact portion 201 of the test head 200 is provided to the lower end portion of the IC device suction device 105d, and the suction/pressing portion 15 is movable in the Z-axis direction (that is, in the upward/downward directions) via a rod 151 by the Z-axis actuator (not shown).

Note that, in the present embodiment, since two IC device suction apparatus 105d are provided to the attachment base 105c, it is possible to pick up, convey, press and release two IC devices 8 at a time.

The two buffer portions 108 are configured to be able to move back and forth by the rails 108a and an actuator (not shown) between operation regions of the two X-Y conveyors 104 and 105. The buffer 108 on the upper side in FIG. 1 performs an operation of conveying an IC device 8 conveyed from the heat plate 106 to the test head 20, and the buffer portion 108 on the lower side in FIG. 1 performs an operation of taking out an IC device 8 finished with the test in the test head 20. Due to existence of the two buffer portions 108, the two X-Y conveyors 104 and 105 can operate at a time without interfering with each other.

The supply tray 102 provided to the operation region of the X-Y conveyor 104 on the substrate 109 is a tray for loading pre-test IC devices 8, and the classifying tray 103 is a tray for storing post-test IC devices 8 by classifying to categories in accordance with test results. In the present embodiment, four classifying trays 103 are provided.

Also, the heat plate 106 provided on the substrate 109 is, for example, a metal plate provided with a heater, formed with a plurality of concave portions 106a for the IC devices 8 to be dropped in, and pre-test IC devices 8 are conveyed by the X-Y conveyor 104 from the supply tray 102 to the concave portions 106a. The heat plate 106 is a heating source for applying a predetermined thermal stress to the IC devices 8. The IC devices 8 are attached to the contact portion 201 of the test head 20 via the buffer portion 108 on the upper side in FIG. 1 after being heated to be a predetermined temperature by the heat plate 106.

As shown FIG. 3, sockets 202 having probe pins 202a as connection terminals are fixed to the contact portion 201 of the test head 20. The probe pins 202a are provided by the number and pitches corresponding to those of connection terminals of the IC device 8 and biased upward by a spring. The probe pins 202a are electrically connected to the tester main body 30 via the test head 20.

The socket 202 is attached with a socket guide 203 having opening portions 203a and guide pins 203b as shown in FIG. 3. IC devices 8 held by suction by the suction/pressing portions 15 of the IC device suction apparatus 105d are pressed against the sockets 202 through the openings 203a of the socket guide 203. At this time, the guide pins 203b provided to the socket guide 203 are inserted to guide holes 152b formed on a pusher base 152, to which the suction/pressing portions 15 of the IC device suction apparatus 105d fit, as a result, the IC devices 8 are aligned with the sockets 202.

Figure 4:
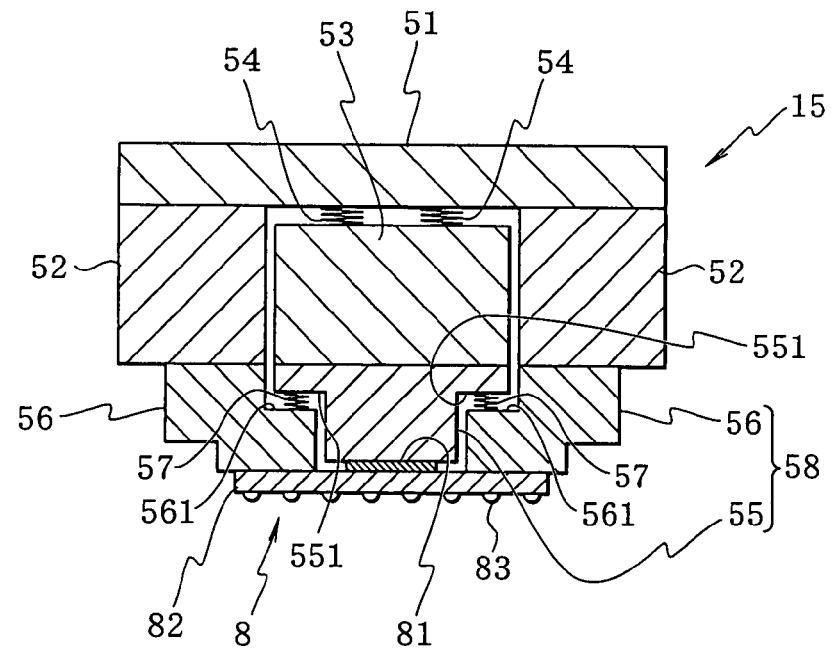
FIG. 4 is a sectional view showing details of a suction/pressing portion in the electronic device testing handling apparatus according to the same embodiment.
Figure 5:
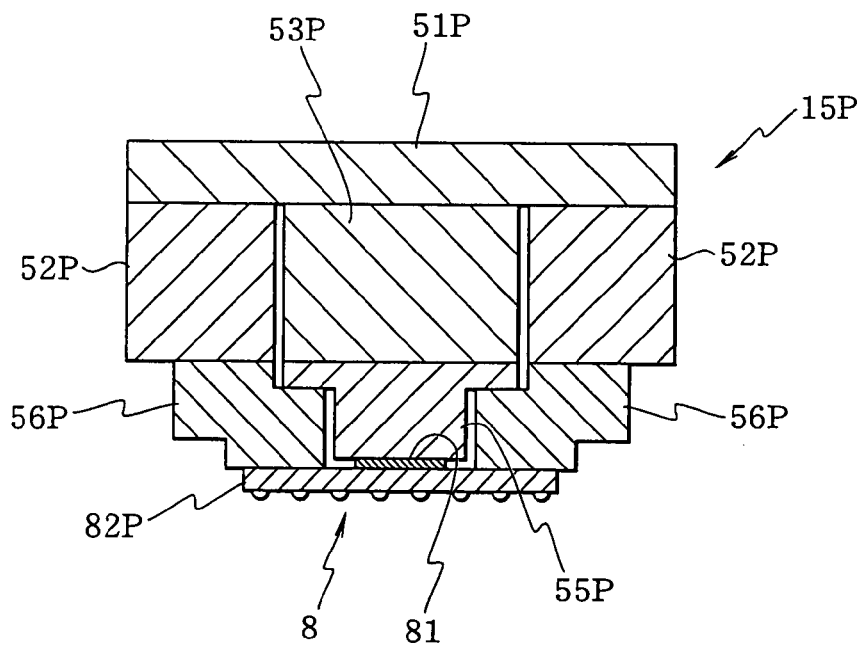
FIG. 5 is a sectional view showing details of a suction/pressing portion in the conventional electronic device testing handling apparatus.
Figure 6:
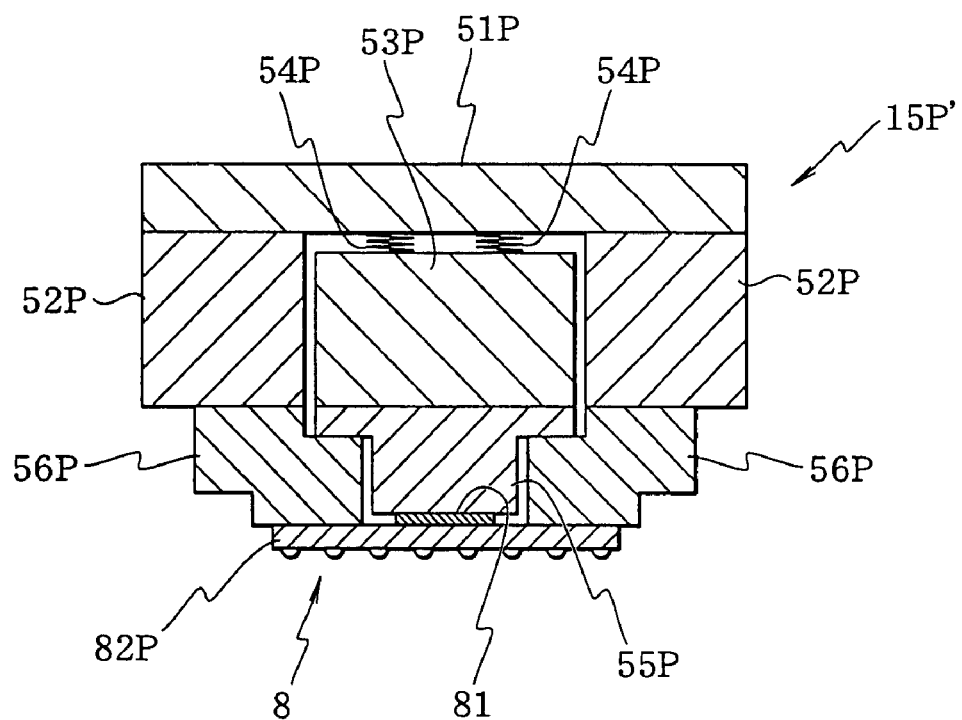
FIG. 6 is a sectional view showing details of a suction/pressing portion in another conventional electronic device testing handling apparatus.

As shown in FIG. 4, the suction/pressing portion 15 of the IC device suction device 105d comprises a support member 51 attached to a tip portion of the rod 151 and driven in the Z-axis direction, a joint member 52 provided to a peripheral portion on the lower side of the support member 51, a heat block 53 provided at the center portion on the lower side of the support member 51, a first pusher 55 provided on the lower side of the heat block 53 for pressing a die 81 of the IC device 8, and a second pusher 56 provided on the lower side of the joint member 52 for pressing a substrate 82 of the IC device 8.

A first spring 54 is provided between the support member 51 and the heat block 53, and the first spring 54 biases the support member 51 and the heat block 53 to the direction of separating them from each other.

A convex portion 551 protruding to the second pusher 56 side is formed on an upper portion of the first pusher 55, and a convex portion 561 protruding to the first pusher 55 side is formed on a lower portion of the second pusher 56. A second spring 57 is provided between the convex portion 551 of the first pusher 55 and the convex portion 561 of the second pusher 56. The second spring 57 biases the first pusher 55 and the second pusher 56 to the direction of separating them from each other.

Note that a spring rate of the first spring 54 is preferably set to be higher than that of the second spring 57.

The heat block 53 is a heating source for heating the first pusher 55 and maintains the IC device 8 to be a predetermined temperature, so that the temperature of the IC device 8 heated by the heat plate 106 is not lowered in the conveying step. Note that in the case of conducting a thermal stress test not under a heating condition but under a cooling condition or in the case where the IC device 8 becomes higher than a set temperature due to self-heating, a cooling source for cooling the first pusher 55 may be used instead of the heat block 53.

Here, the first pusher 55 and the second pusher 56 are attached as a change kit 58 in a removable way to the body side provided with the support member 51, the joint member 52 and the heat block 53. A method of attaching the change kit 58 in a removable way is not particularly limited and, for example, a method of using a buckle may be applied.

In the suction/pressing portion 15 having the above configuration, a load of pressing the die 81 of the IC device 8 and a load of pressing the substrate 82 of the IC device 8 by the first pusher 55 and the second pusher 56 can be separately managed. Namely, it is possible to press with a load of not damaging an integrated circuit against the die 81 of the IC device 8 and press with a load capable of preventing a contact mistake against the substrate 82 of the IC device 8.

Also, in the suction/pressing portion 15, the first spring 54 provided between the support member 51 an the heat block 53 biases the heat block 53 downwardly, and the second spring 57 provided between the first pusher 55 and the second pusher 56 biases the first pusher 55 upwardly and the second pusher 56 downwardly, so that both of surface conformance of a lower surface of the heat block 53 and an upper surface of the first pusher 55, and surface conformance of a lower surface of the first pusher 55 and an upper surface of the die 81 of the IC device 8 are secured. Accordingly, uniform pressing against the fine die 81 of the IC device 8 in the surface direction with an accurate load becomes possible, and a heat transfer property from the heat block 53 to the IC device 8 via the first pusher 55 becomes excellent, so that reliable temperature control of the die 81 can be attained.

Furthermore, due to the elastic effect of the second spring 57 provided between the first pusher 55 and the second pusher 56, the load on the die 81 of the IC device 8 can be managed by securing a certain range, so that it is possible to respond to changes of kinds of the IC devices 8 without changing the first pusher 55 and the second pusher 56 (change kit 58). Furthermore, when the load cannot be managed by using the same the second spring 57, it is possible to respond to changes of kinds of the IC devices 8 by changing the second spring 57, specifically, by changing to a change kit 58 provided with a second spring 57 having a spring rate capable of managing the load. The change of the change kit 58 can be extremely easily attained comparing with change of the first spring 54 provided on the main body side. Note that when the load has to be widely changed due to the change of kinds of the IC devices 8, it can be attained by changing the first spring 54.

Below, the case of testing an IC device 8 under a high temperature condition will be taken as an example for explaining an operation of the electronic device testing apparatus 1.

The IC device suction device 104d of the X-Y conveyor 104 holds by suction a pre-test IC device 8 loaded on the supply tray 102 of the handler 10, conveys to the concave portion 106a of the heat plate 106 and releases the IC device 8 above the concave portion 106a. By being left for a predetermined time on the heat plate 106, the IC device 8 is heated to be a predetermined temperature. The IC device suction device 104d of the X-Y conveyor 104 holds by suction the IC device 8 heated to be a predetermined temperature by the heat plate 106, conveys to the buffer portion 108 positioning at the left end of the rail 108a in FIG. 1, and releases the IC device 8 above the buffer portion 108.

The buffer portion 108 loaded with an IC device 8 moves to the right end of the rail 108a in FIG. 1. The IC device suction device 105d of the X-Y conveyor 105 holds by suction the conveyed IC device 8 on the buffer portion 108 and conveys to the contact portion 201 of the test head 20. Then, the IC device suction device 105d of the X-Y conveyor 105 presses the IC device 8 against the socket 202 of the contact portion 201 through the opening portion 110 of the substrate 109.

At this time, in the suction/pressing portion 15 of the IC device suction device 105d, the die 81 of the IC device 8 is pressed by the first pusher 55 and the substrate 82 of the IC device 8 is pressed by the second pusher 56, so that the die 81 and the substrate 82 of the IC device 8 can be pressed with different loads. Moreover, since the suction/pressing portion 15 is provided with the first spring 54 and the second spring 57, it is possible to uniformly press the die 81 of the IC device 8 with an accurate load as explained above.

Also, since the suction/pressing portion 15 of the IC device suction device 105d is provided with the heat block 53, it is possible to prevent the temperature of the IC device 8 heated by the heat plate 106 from lowering by heating the first pusher 55 by raising the temperature of the heat block 53. Furthermore, since the suction/pressing portion 15 is provided with the first spring 54 and the second spring 57, temperature control of the die 81 of the IC device 8 can be surely made as explained above.

When the suction/pressing portion 15 of the IC device suction device 105d presses the IC device 8 against the socket 202 of the contact portion 201 and external terminals 83 of the IC device 8 are connected to the probe pins 202a of the socket 202, a test signal is applied to the IC device 8 from the tester main body 30 through the test head 20. A respond signal read from the IC device 8 is sent to the tester main body 30 through the test head 20, so that performance and functions, etc. of the IC device 8 are tested.

When the test on the IC device 8 is finished, the IC device suction device 105d of the X-Y conveyor 105 conveys the post-test IC device 8 to the buffer portion 108 positioning at the right end of the rail 108a in FIG. 1, and the buffer 108 moves to the left end in FIG. 1. The IC device suction device 104d of the X-Y conveyor 104 holds by suction a post-test IC device 8 from the buffer portion 108 and stores on the classifying trays 103 in accordance with the test results.

The embodiment explained above is for easier understanding of the present invention and not to limit the present invention. Accordingly, respective elements disclosed in the above embodiments include all modifications in designs and equivalents belonging to the technical field of the present invention.

For example, instead of the first spring 54 and/or the second spring 57, an elastic body, such as rubber or thermoplastic elastomer, may be used.

INDUSTRIAL APPLICABILITY

As explained above, according to the pressing member and electronic device handling apparatus according to the present invention, it is possible to respond to changes of kinds of electronic devices, surface conformance can be improved, and an electronic device can be uniformly pressed with an accurate load. Namely, the pressing member and electronic device handling apparatus of the present invention are useful to conduct tests on many kinds of electronic devices requiring accurate load management.

The invention claimed is:

1. A pressing member for pressing terminals of an electronic device to be tested against a contact portion of a test head in an electronic device handling apparatus, comprising:
   a first pressing member for pressing a first part of the electronic device by being pressed by a body side-first pressing member made of an inelastic body and elastically biased in the pressing direction,
   wherein said body side-first pressing member has a temperature control function for controlling a temperature of said first pressing member,
   a second pressing member for pressing a second part of the electronic device by being pressed by a body side-second pressing member made of an inelastic body,
   a convex portion protruding to the second pressing member side formed on an upper portion of the first pressing member;
   another convex portion protruding to the first pressing member side formed on a lower portion of the second pressing member; and
   an elastic body provided between the convex portion of the first pressing member and the another convex portion of the second pressing member, the elastic body biasing the first pressing member and the second pressing member to the direction of separating them from each other,
   wherein said first pressing member and said second pressing member are elastically connected in the pressing/receding direction, wherein the first pressing member presses a die of an electronic device to be tested, and the second pressing member presses a substrate of the electronic device to be tested.

2. A pressing member for pressing terminals of an electronic device to be tested against a contact portion of a test head in an electronic device handling apparatus, comprising:
   a first pressing member for pressing a first part of the electronic device by being pressed by a body side-first pressing member made of an inelastic body and elastically biased in the pressing direction,
   a second pressing member for pressing a second part of the electronic device by being pressed by a body side-second pressing member made of an inelastic body,
   a convex portion protruding to the second pressing member side formed on an upper portion of the first pressing member;
   another convex portion protruding to the first pressing member side formed on a lower portion of the second pressing member; and
   an elastic body provided between the convex portion of the first pressing member and the another convex portion of the second pressing member, the elastic body biasing the first pressing member and the second pressing member to the direction of separating them from each other, wherein
   said first pressing member and said second pressing member are elastically connected in the pressing/receding direction, wherein the first pressing member presses a die of an electronic device to be tested, and the second pressing member presses a substrate of the electronic device to be tested, and
   said pressing members are attached in a removable way to an electronic device handling apparatus body side provided with said body side-first pressing member and said body side -second pressing member.

* * * * *